(12) United States Patent
Gratz et al.

(10) Patent No.: US 7,557,444 B2
(45) Date of Patent: Jul. 7, 2009

(54) POWER-VIA STRUCTURE FOR INTEGRATION IN ADVANCED LOGIC/SMART-POWER TECHNOLOGIES

(75) Inventors: Achim Gratz, Dresden (DE); Jakob Kriz, Weinbohla (DE); Woong-Jae Chung, Dresden (DE)

(73) Assignee: Infineon Technologies AG, Munich (DE)

( * ) Notice: Subject to any disclaimer, the term of this patent is extended or adjusted under 35 U.S.C. 154(b) by 146 days.

(21) Appl. No.: 11/525,107

(22) Filed: Sep. 20, 2006

(65) Prior Publication Data
US 2008/0067688 A1 Mar. 20, 2008

(51) Int. Cl.
*H01L 23/48* (2006.01)

(52) U.S. Cl. .................. 257/734; 257/774; 257/500; 257/691

(58) Field of Classification Search .............. 257/734, 257/774
See application file for complete search history.

(56) References Cited

U.S. PATENT DOCUMENTS

2004/0255258 A1* 12/2004 Li .................................. 716/8

* cited by examiner

*Primary Examiner*—N Drew Richards
*Assistant Examiner*—Swapneel Chhaya
(74) *Attorney, Agent, or Firm*—Brinks Hofer Gilson & Lione

(57) ABSTRACT

A via structure is disclosed for use in a multi-layered semiconductor device, for forming electrical contacts between prescribed layers of the vertically aligned structures. The via structures include a plurality of adjacent frame shaped hole structures which extend between the prescribed layers of the device, and which are filled with metal to form frame shaped vias. The width of each of the sides of the frame is chosen to be equal to an integer multiple of half of the minimum pitch of the semiconductor processing, with the distance between adjacent frame shaped via structures being approximately equal to an integer multiple of half of the minimum pitch of the semiconductor processing.

28 Claims, 3 Drawing Sheets

1d)

1b)

1e)

1c)

2b)

2c)

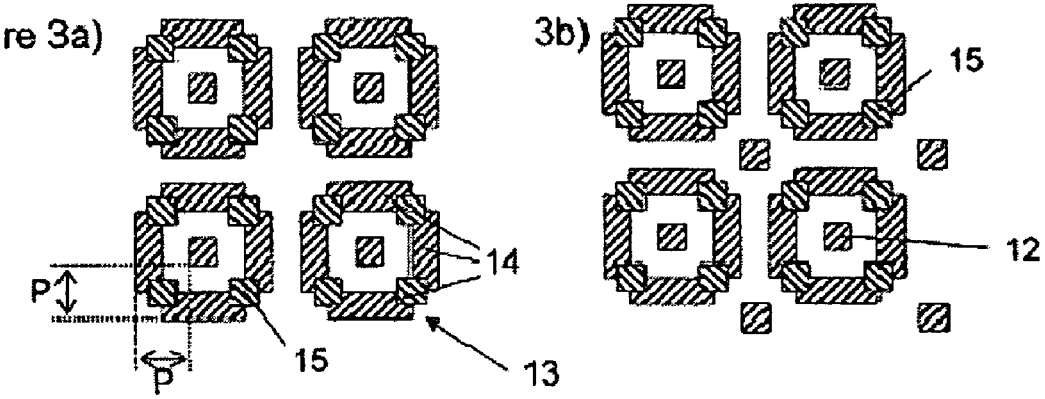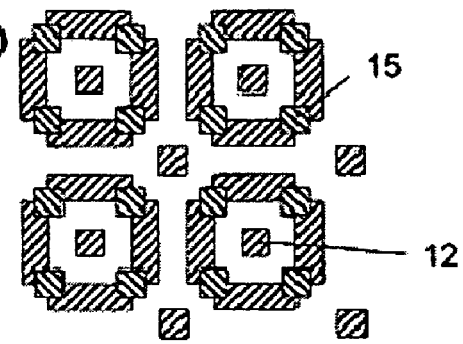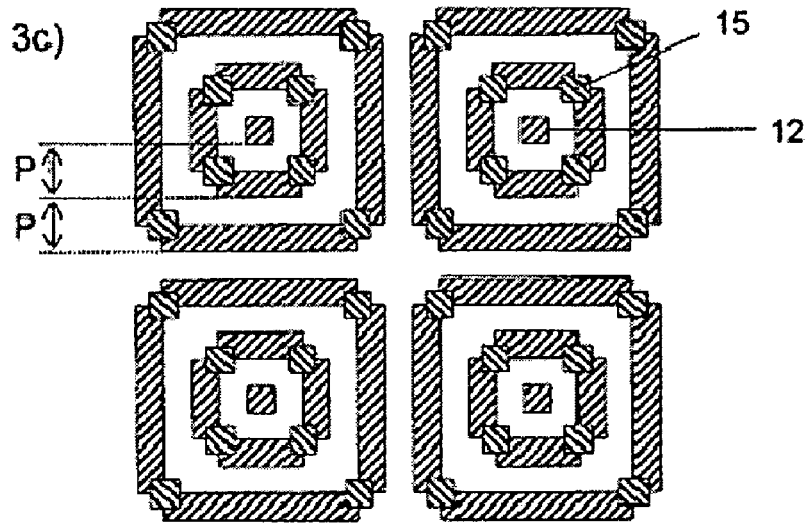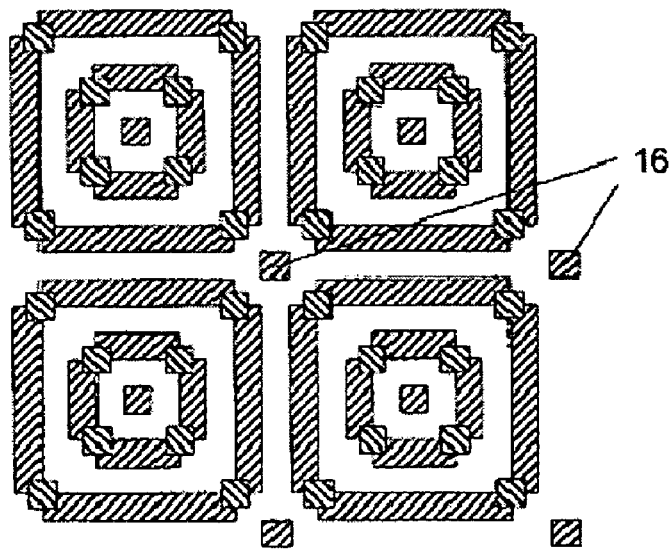
Figure 3a) 3b) 3c) 3d)

POWER-VIA STRUCTURE FOR INTEGRATION IN ADVANCED LOGIC/SMART-POWER TECHNOLOGIES

BACKGROUND

1. Technical Field

The invention relates to power circuits, and particularly, to via structures in smart-power circuits.

2. Background Information

Current semiconductor device technology typically provides semiconductor substrates comprising multiple layers for device formation. In order that the necessary number of devices can be incorporated within a reasonably sized semiconductor substrate, and in order to provide for the required external connections, it is common to provide these multiple layers within the semiconductor device which allow for a multi-layered structure. Such a multi-layered architecture of devices will clearly improve the density of devices for a given area, and allow for more complex and powerful circuitry and devices to be provided.

Within multiple layered devices, it is necessary for connections to be made between certain given layers within the structures. Such connections are generally provided by metallic vias, which extend between given layers of the multi-layered structure. Such vias allow for electrical connection between vertically aligned layers, either for providing signals or power or the like, to each of the layers and devices held therein.

Typically, vias are designed as squares in cross-section, which extend between the chosen layers of the multi-layer substrate. While such vias are convenient and appropriate for low power devices, or signal transfer, more significant difficulties are encountered when applied to power devices. The use of higher power in multi-layer devices, requires that the via structures carry increased currents. Increased currents through small metallic vias, will lead to higher resistance effects and resistive heating thereof. In many applications, such effects can be significant and actually degrade performance of the multi-layer structures. To overcome the problems associated with resistance of small via structures, it is common to either provide elongate via structures, which are essentially elongated rectangles in cross-section which pass between the chosen layers, or larger filled vias which have an increased two dimensional cross-sectional area, i.e. large area squares. In both of these cases, the increased volume of the via improves the resistive heating effects.

Unfortunately, while elongate vias or larger surface area vias show improved resistance effects, the patterning and processing of such vias can be troublesome. In particular, long elongate vias can suffer from seam formation during metallization stages. During the deposition of the metal into the via structures, such metal will tend to grow inwards from the side walls of the via holes, and may form a seam at the center of the via. Additionally, the metal may form a complete layer at the top of the via prior to fully filling the via hole structure, which leads to voids running along the length of the elongate via. This degrades the resistance improvement effects of such a via, and can also lead to significant problems when surface planarization is required.

The larger two dimensional via structures, while in principle leading to high density and low resistance, suffer from inhomogeneities in the metal deposition, and furthermore during planarization such structures do not give fully planar top surfaces in line with the semiconductor substrate.

BRIEF SUMMARY

A via structure in a multi-layered semiconductor device is disclosed, that forms electrical connections between prescribed ones of vertically aligned layers in the device. The via structure includes a plurality of adjacent frame shaped hole structures which extend between a prescribed number of the vertically aligned layers in the device and which are filled with a metal to form frame shaped vias.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 3 shows frame shaped vias including internal via structures, and additional via structures between the frame shaped vias or sets.

DETAILED DESCRIPTION

Figure 1A:
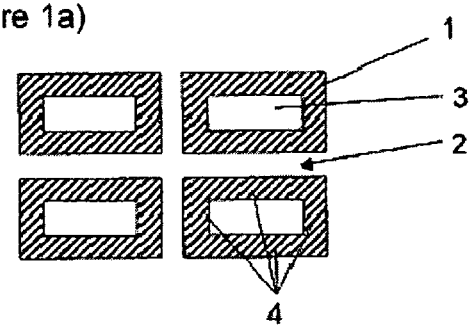
FIG. 1 shows frame shaped via structures.
Figure 1A:
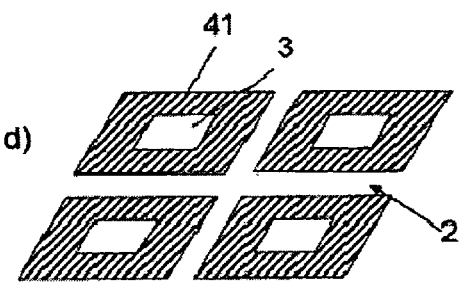
Figure 1A:
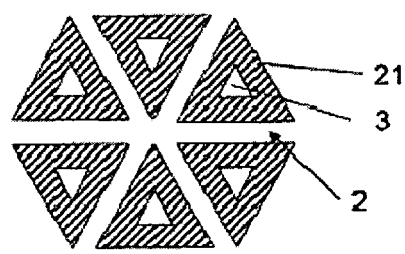
Figure 1A:
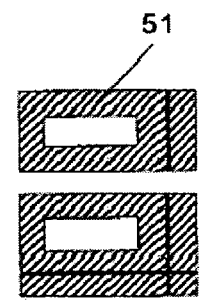
Figure 1A:
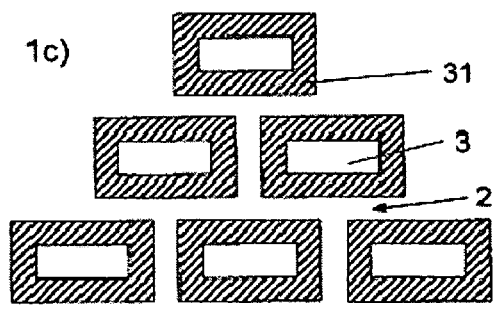
Figure 2A:
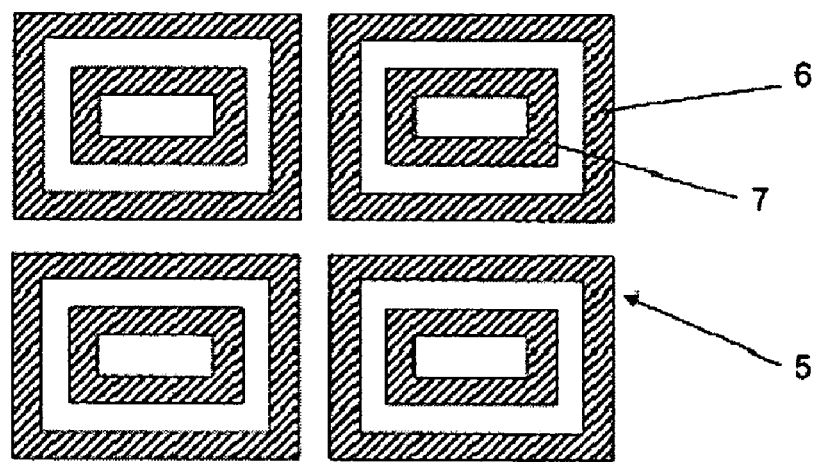
FIG. 2 shows frame shaped via sets.
Figure 2A:
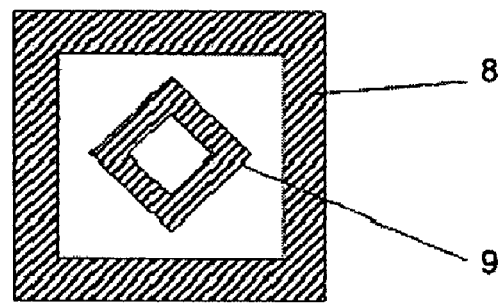
Figure 2A:
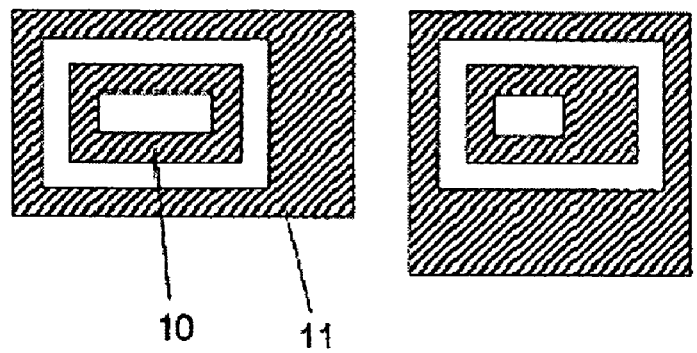

In FIGS. 1 to 3, numerous different design options for via structures are shown. Within each of the figures, the general via structure is shown in hatched areas, and the figures all show a plan view of the top exposed surface of the semiconductor substrate. To overcome structural difficulties such as seam-formation in longitudinal via patterns or inhomogeneity in large surface structures, the via structures possess generally short and generally narrow line structures ordered into frame patterns.

While each of FIGS. 1 to 3 shows arrays of frame shaped vias on a surface of the semiconductor 2, it is to be understood that this is purely by way of example. As is common with via technology, in particular when used with multi-layer semiconductor device structures, the via structures are provided to form connections between any of the vertical layers therein. That is, it is possible for the via structures shown in each of the figures to be substantially hidden beneath higher layers of the semiconductor device, and indeed for these via structures to pass from any of the layers therein to any of the other layers therein. Furthermore, it is possible for the via structures to pass from one layer to another through numerous layers without making any electrical contact to these mid-layers. As is normal within multi-layer semiconductor devices, the layers through which the via structures pass can comprise many different materials, such as metallization layers, semiconductor layers, insulating layers or dielectric layers.

Turning now to the via structures shown in FIG. 1, numerous possible designs for frame shaped via structures 1, 21, 31, 41, 51 are shown. The common linking feature between each of the possible options in FIGS. 1a to 1d, are those of a frame shaped via structure which surrounds a central unpatterned region 3 of the semiconductor substrate 2. In each of these designs, the minimum width of each of the sides making up the frame shaped via structure 1, 21, 31, 41 is limited by the semiconductor processing. That is, the semiconductor processing used for patterning the devices has a minimum resolution for pattern definition, and also clearly for spacing between such patterns.

The provision of frame shaped via structures 1, 21, 31, 41 also greatly increases the cross-sectional area of the frame shaped via structures 1, 21, 31, 41 without incurring the difficulties with further processing as are found with elongate via structures or large filled surface area via structures. The short and narrow sides to the frame shaped via structures 1, 21, 31, 41 may be reliably patterned in a single exposure of the semiconductor device, and furthermore are reliably further processed for the hole formation and subsequent metalization.

The formation of the frame shaped via structures according to each of FIGS. 1 to 3, is substantially the same. That is, during device formation and at the position where a via structure is required, the exposed surface of the multi-layer semiconductor device is patterned in the usual way with a photoresist polymer. The polymer is then patterned in the normal manner, preferably using harmonic photolithographic techniques, so as to expose particular regions of the semiconductor surface 2. Each of these exposure patterns is generally in a frame-shape according to any of the patterns shown in FIGS. 1 to 3. The designs shown in FIGS. 1 to 3 are meant entirely as examples, and it will be obvious to the skilled person that further shapes, patterns, and array ordering of the frame shaped vias is obvious and falls within the scope of the disclosure.

Once the photoresist lying on top of the exposed surface of the multi-layer semiconductor device has been patterned in the above manner, the semiconductor device is exposed to relevant etches. These etches include the techniques of reactive ion etching, plasma etching, wet chemical etching, and other etch techniques. The etch is tailored to create a hole within the multi-layer semiconductor device of a required depth. That is, the etch passes from the currently exposed layer of the device down through a required number of the layers in the device, to the chosen layer. At this point, if exposed layers between the top surface and the chosen lower layer do not require electrical contact, processes such as oxidation of the semiconductor or exposed metal layer can be undertaken to create an insulating structure. Once the hole has been patterned in the semiconductor substrate, a metal of the chosen type is deposited over the surface and into the frame shaped via holes. Such deposition is well known, and it is intended that all known techniques be encompassed in the disclosure.

Because the frame shaped via holes have been patterned with a short length and narrow width, no substantial inhomegeneities are suffered with the metal layer depositions. Once each of the frame shaped via holes has been appropriately filled with the metallic structure, the surface must be planarized to remove all of the unwanted deposited metals. The planarization of the semiconductor process removes all of the metallic material which does not lie within the frame shaped via holes. After planarization, only the frame shaped via holes contain metallic material, thus creating the frame shaped via structures according to each of the figures. Preferably, the step of planarization is one of chemical mechanical polishing, CMP. At this stage, further device layers may be deposited over the via structures 1, to create buried vias.

As is shown in each of FIGS. 1 to 3, both the widths of the sides of each of the frame shaped via structures and the gaps between adjacent structures on the semiconductor substrate surface 3 are limited by the semiconductor processing. Clearly it is advantageous to provide these distances to be as small as possible, to improve the density and patterning reliability.

In FIGS. 1a to 1e, it is clear that a number of frame-shapes and sizes are shown in an array structure. This improves the fill density of the via structures, while also improving the reliability of a semiconductor processing, as detailed above. In particular, FIGS. 1a to 1d show simple frame shaped patterns 1, 21, 31, 41, which are arranged adjacent to each other. As is clear from these four designs, the simple frame shaped structures 1, 21, 31, 41 may comprise frames of any shape and size, and may be arranged in the semiconductor substrate 2 in any chosen array pattern.

The main requirement in choosing the frame shaped via structure pattern, is that the structures form that of a frame, i.e. having semiconductor layer portion within the metallic frame patterning; that the length of any of the sides of the frame shaped structures 1, 21, 31, 41 is maintained to be reasonably short so as to avoid metallic infilling problems. To improve the ease of semiconductor processing, it is advantageous for the frame shaped via structures 1, 21, 31, 41 to be in the form of a parallelogram, comprising four elongate via elements 4. The use of a parallelogram for the frame shaped via structure 1, 31, 41 improves the ease of pattern formation during the semiconductor processing, as the lines lie substantially parallel with each other. Further, the parallelogram may be that of a rectangular or square shape, such that the elongate via elements 4, making up the size of the parallelogram, are arranged at 90° with respect to each other. This further improves the ease of pattern formation, while also further improving the metallic deposition for via structure formation.

As can be seen in FIG. 1e, it is not required that the frame shaped via structures 51 are identical in shape and size. Indeed, as can be seen from the four examples given in this figure, one or more of the sides of the respective frame may be of different width, or the unpatterned center region 3 of the frame shaped via structure 51 may be offset from the center. In FIG. 1e, the solid black lines indicate the minimum width distance of the semiconductor process, showing how frames of this type can be patterned. Providing the frame shaped via structures 1, 21, 31, 41 of the same shape and size, improves the array formation in the semiconductor substrate 2. Additionally, this further improves the ease of processing and the fill density of the full array of frame shaped via structures 1, 21, 31, 41.

In FIG. 2, further designs of the frame shaped via structures can be seen. In the structures according to FIGS. 2a to 2c, individual frame shaped via structures are arranged into frame shaped via sets 5. In FIG. 2a, each of these frame shaped via sets 5 comprises a plurality of frame shaped via structures 6, 7 of different sizes, with larger frame shaped via structures 6 lying around smaller frame shaped via structures 7. In FIG. 2a, the larger frame shaped via structures are numbered 6 and the smaller structures numbered 7. While in the figures each of the frame shaped via sets 5 comprises two frame shaped vias 6, 7, this is by way of example only. It is quite clear to the person skilled in the art, that any number of frame shaped via structures 6, 7 could be incorporated within the frame shaped via sets 5.

As with the structures according to FIG. 1, the frame shaped vias 6, 7 making up the frame shaped via sets 5, are patterned with consideration of the semiconductor processing limitations, such that the pattern formation for frame shaped via formation is straightforward and reliable.

Once again, as with the structure shown in FIG. 1, the frame shaped via sets 5 are intended to form large arrays of such sets 5 over the semiconductor device substrate 2. This is shown in FIG. 2a, although the structures of 2b and 2c are also intended to be formed into arrays.

While FIG. 2a shows frame shaped via structure sets 5 which are of similar shape and size and arranged on the respective layer surface 2 in a regular array, this is shown purely by example. As can be seen from FIGS. 2b and 2c, the frame shaped via sets 5 may be comprised of other frame shaped via structures 8-11, which are possessed of frames with different shapes and sizes. As with the discussion related to FIG. 1e, the skilled person will be well aware that numerous patterns and different designs for the frame shaped via structures 1, 6-11 are possible, and are merely obvious options available. Not only can the widths of the sides of the frame shaped vias 6-11 in the frame shaped via sets 5 be different throughout the set, but also the spacing between the adjacent structures in the frame shaped via set 5 can differ.

As with the simple frame structure designs 1, 21, 31, 41, 51 according to FIG. 1, the frame shaped via sets 5 according to FIG. 2 may be formed as parallelograms. Furthermore, these parallelograms may be either simple rectangular in shape or square. As was discussed above with relation to the designs in FIG. 1, this leads to an improvement in both the semiconductor processing patterning and the metallization of structures.

In all of the designs shown in each of FIGS. 1 to 3, while it is possible for the sides making up the frame shaped via structures 1, 21, 31, 41, 6-11, to be of any width, it is possible that each of these widths is in fact equal to the minimum definable size as determined by the semiconductor processing. That is, each of the sides of the pattern of the frame shaped via structure 1, 21, 31, 41, 6-11 is of a width equal to the minimum definable size of the semiconductor processing, and each of the gaps between adjacent patterned via structure is equal to the same. This is advantageous, as it improves both the reliability of via 1, 21, 31, 41, 6-11 formation, in particular with relation to the metallic deposition steps, but also improves the in-fill density of via structures 1, 21, 31, 41, 6-11. This is because the adjacent frame shaped via structures 1 or adjacent frame shaped via sets 5 can be arranged this minimum distance apart. Indeed, it is possible to reliably pattern arrays of either frame shaped vias 1 or sets of frame shaped vias 5, with a surface fill density of approximately 45%.

As is further shown in FIG. 3, it is possible to provide a central via structure 12 lying in the center of the semiconductor frame or innermost semiconductor frame 7 of the sets 5. While in FIG. 3 each of the frame shaped vias is shown as square, therefore leading to a simple square central feature 12, this is by way of example only. It is quite clear to the person skilled in the art, that any of the frame shaped via designs according to any of the figures could be designed with a further central via structure 12.

The rectangular frame shaped vias 1, 31 as seen in FIGS. 1a and 1c, and via sets 5 shown in FIG. 2a as well as the square-shaped via sets 13 seen in FIG. 3 all show that the widths of the via elements making up the size of each of the frames 1, 5, 13, 31 is equal to half of a minimum pitch distance. In this matter, the minimum pitch distance is defined as the minimum center to center distance between adjacent features which can be patterned as determined by the lithography. Another way of defining this distance would also be the distance from one side of one of a feature to the same point on an adjacent feature. In the figures, however, showing the widths of each of the sides of the frame shaped vias as being approximately half of the minimum pitch, is merely by way of example. It is intended that the combined width of the elongate via structures making up the sides of each of the frame shaped vias 1, 5, 13, 31, with the distance between either adjacent elongate via structures in the same frame, or in an adjacent frame, be a multiple of this minimum pitch. Also, in the case of a structure with a central via, the combined distance of the central via and the distance between this and the inner side of the frame shaped via is a multiple of the minimum pitch. In FIGS. 3a and 3c, the minimum pitch of the processing is shown, and referenced by P, wherein the width of the via elements and the gap there between is shown to be equal to this minimum pitch.

As is shown in the structures according to FIG. 3, it is possible to further structure the frame shaped via configurations. In particular, as can be seen from these designs, the frame shaped via structures 13 are comprised of a plurality of elongate structure elements 14. These elongate via elements 14 make up the majority of the frame shaped via 13 shape. While in FIG. 3 only square frame shaped vias and square frame shaped via sets are shown, this is by way of example only. It is clear to the person skilled in the art that the discussion with relation to the frames in FIG. 3, applies equally to those shapes and designs shown in FIGS. 1 and 2, and with their equivalents.

In particular, it is to be noted in the structures according to FIG. 3, that each of the frame shaped via structures 13 is comprised of a plurality of elongate via elements 14 which do not completely join at the corners of the frame-shape 13. That is, the elongate via elements 14 extend toward the corners of the frame-shape 13, but do not meet and thereby leave the corners of the frame substantially unformed. This is an advantageous structure for the actual semiconductor processing, as precise corner formation at the limits of semiconductor processing can be troublesome.

In order to form a frame shaped via structure 13, it is possible to provide bridging vias 15 (shown in the figures with opposite shading, purely for means of clarity) overlapping the ends of each of the elongate via elements 14 in the corner regions. This is shown in each of FIGS. 3a to 3d. By providing the bridging via structure 15, in a position which overlaps the unformed corners of the frame shaped vias 13, it is possible to more reproduceably form corners in the frame shaped via structures 13, and therefore generate continuous frame-shapes. It is intended, that these bridging structure vias 15 lie slightly inward, that is more towards the center of the frame shaped via structure 13, than the elongate via elements 14 making up the sides of the frame-shape. Within the patterning and further processing of the frame shaped vias 13, providing the bridging structures 15 at such a location will tend to lead to slightly rounded corners in the final pattern of the frame shaped via 13, which are formed more reliably than straight edge corners providing a precise 90° angle. Clearly, if the structure is not that of a rectangle or square the same discussion applies, with rounded corner formation of the structures being more successful than precise angular formation of structures. This bridging via structure 15 may lie at the ends of the elongate via elements 14, overlapping the inner half of each of the elongate via elements 14. While in the figures, these bridging vias 15 are shown to have the same width as the elongate via elements 14, this is by way of example only. Indeed, the bridging vias 15 can have a smaller or longer width/side length as required.

As a further option for design of frame shaped via structures, a further via structure 16 may be provided at a location lying between the arrays of pattern frame shaped vias or via sets 5. As is shown in FIGS. 3b and 3d, this additional via structure 16 lies substantially within the gap regions of the frame shaped vias 1 or via sets 5. The precise location of this additional structure 16 is not intended to be limited to the position shown in FIGS. 3b and d, and this is shown simply by way of example. This additional structure 16 is intended to lie at a position which would relate to interference patterns caused by side lobes in the patterning of the substrate.

As the patterning of the substrate may be undertaken by means of high harmonic or interference lithography, it is always a concern that side lobes within this interference lithography are formed at positions of interference in the patterning radiation. To negate any such effects leading to unreliable patterning, the design for frame formation is chosen such that it includes these additional elements 16 at positions which could relate to said interference. In this manner the patterning of the via structures in the surface can be substantially improved, and no extraneous poorly formed via structures will result.

While the structures have been shown separated into three figures, and discussed separately above, this is not intended as a limitation. Indeed, any of the features relating to any of the figures can clearly by combined in any frame shaped design, and these will be obvious to the person skilled in the art. That is, for example, the additional structure 16 or the central via structures 12 may be combined with any of the structures described, and further the use of elongate via elements 14 not fully forming corners in the frame shaped vias 13, can be combined with any shape for via formation. Indeed, the above discussion is presented by way of example only, and is not intended as a full or limiting disclosure of the current invention. The current invention is more clearly defined in the attached claims and their equivalents.

The invention claimed is:

1. A via structure in a multi-layered semiconductor device for forming electrical connections between prescribed ones of vertically aligned layers in the device, the via structure comprising a plurality of adjacent frame shaped hole structures which extend between a prescribed number of the vertically aligned layers in the device and which are filled with a metal to form a plurality of frame shaped vias, wherein the frame shaped vias are each comprised of, respectively:
   four elongate via elements which do not join at corners of the frame shaped vias; and
   a plurality of corner elements, each bridging a respective pair of the four elongate via elements.

2. The via structure according to claim 1, wherein the corner elements each overlap respective inner halves of ends of respective elongate via structures.

3. The via structure according to claim 1, wherein each of the plurality of frame shaped vias is of the same shape and size.

4. The via structure according to claim 1, wherein the widths of each of the elongate via elements of the plurality of frame shaped vias are the same.

5. The via structure according to claim 1, wherein each of the plurality of frame shaped vias includes a respective central via.

6. The via structure according to claim 1, wherein the sum of a width of a first elongate via element and a distance between this first elongate via element and a second elongate via element lying parallel with and adjacent to this first elongate via element in the same frame shaped via, is a multiple of a minimum pitch, wherein the minimum pitch is defined as the minimum center to center distance between structures which can be formed in the multi-layered semiconductor device.

7. The via structure according to claim 1, wherein the sum of a width of a first elongate via element of a first frame shaped via and a distance between this first elongate via element and a second elongate via element lying parallel with and adjacent to this first elongate via element in an adjacent second frame shaped via, is a multiple of a minimum pitch, wherein the minimum pitch is defined as the minimum center to center distance between structures which can be formed in the multi-layered semiconductor device.

8. The via structure according to claim 5, wherein the sum of a width of a first frame shaped via and a distance between the first frame shaped via and an adjacent elongate via element of a second frame shaped via is a multiple of a minimum pitch, wherein the minimum pitch is defined as the minimum center to center distance between structures which can be formed in the multi-layered semiconductor device.

9. The via structure according to claim 1, wherein a first of the plurality of frame shaped vias is rectangular in shape, and the sum of a width of a first elongate via element of the first frame shaped via and a distance between the first elongate via element and a second elongate via element lying parallel with and adjacent to the first elongate via element in the first frame shaped via, is a multiple of a minimum pitch, wherein the minimum pitch is defined as the minimum center to center distance between structures which can be formed in the multi-layered semiconductor device.

10. The via structure according to claim 9, wherein the sum of a width of the first elongate via element and a distance between the first elongate via element and a second elongate via element lying parallel with and adjacent to the first elongate via element in a second adjacent frame shaped via, is a multiple of the minimum pitch.

11. The via structure according to claim 1, wherein a side of a first frame shaped via is formed by a semiconductor process that includes a wavelength of radiation for forming the side, and wherein the width of the side of the first frame shaped via is narrower than said wavelength of radiation.

12. The via structure according to claim 11, wherein a further via is provided at a position lying in between the first frame shaped via and a second frame shaped via at a position which correspond to side-lobes in interference patterns of the radiation.

13. The via structure according to claim 1, wherein the via structure extends between at least two layers within the multi-layered semiconductor device.

14. A via structure in a multi-layered semiconductor device for forming electrical connections between prescribed ones of vertically aligned layers in the device, the via structure comprising a plurality of frame shaped hole structures of differing sizes which extend between a prescribed number of the layers of the device, with larger frame shaped hole structures surrounding smaller frame shaped hole structures, and wherein the frame shaped hole structures are filled with metal to form sets of one-inside-another frame shaped vias, wherein the frame shaped vias are comprised of:
   a plurality of elongate via elements which do not completely join at corners; and
   a plurality of corner elements, each bridging a respective pair of the elongate via elements.

15. The via structure according to claim 14, wherein the frame shaped vias each comprise four elongate via elements.

16. The via structure according to claim 15, wherein the corner elements each overlap respective inner halves of ends of respective elongate via elements.

17. The via structure according to claim 14, wherein each of the frame shaped vias in each set is of the same shape, and the respective centers of each of the frame shaped vias within each set are aligned.

18. The via structure according to claim 14, wherein the widths of each of the elongate via elements of the frame shaped via in each set are the same.

19. The via structure according to claim 14, wherein a further central via is provided within the innermost frame shaped via of the set, wherein the central via is spaced apart from the internal edge of the innermost frame shaped via of the set.

20. The via structure according to claim 14, wherein each frame shaped via is square in shape.

21. The via structure according to claim 20, wherein the sum of the width of a first via element of a first frame in the set and a distance between this first element and a second element lying parallel with and adjacent to this first via element in an adjacent frame in the same set, is a multiple of the minimum pitch, wherein the minimum pitch is defined as the minimum center to center distance between structures which can be formed in the multi-layered semiconductor device.

22. The via structure according to claim 20, wherein the sum of the width of a first via element of the outermost frame in the set and a distance between this first element and a second element lying parallel with and adjacent to this first via element in the outermost frame of a second adjacent set, is a multiple of the minimum pitch, wherein the minimum pitch is defined as the minimum center to center distance between structures which can be formed in the multi-layered semiconductor device.

23. The via structure according to claim 20, wherein a further central square via is provided within the innermost square frame shaped via of the set, wherein the central square via is spaced apart from the internal edge of the innermost frame shaped via and,
the sum of the width of the square shaped via and the distance between this and the adjacent via element of the innermost frame shaped via is a multiple of the minimum pitch,
wherein the minimum pitch is defined as the minimum center to center distance between structures which can be formed in the multi-layered semiconductor device.

24. The via structure according to claim 14, wherein each frame shaped via in the set comprises four elongate via elements and is rectangular in shape, and the sum of the width of a first via element of a first frame in the set and a distance between this first element and a second element lying parallel with and adjacent to this first via element in an adjacent frame of the set, is a multiple of the minimum pitch, wherein the minimum pitch is defined as the minimum center to center distance between structures which can be formed in the multi-layered semiconductor device.

25. The via structure according to claim 14, wherein the sum of the width of a first via element of the outermost frame in a first set and a distance between this first element and a second element lying parallel with and adjacent to this first via element in an outermost frame of a second adjacent frame set, is a multiple of the minimum pitch, wherein the minimum pitch is defined as the minimum center to center distance between structures which can be formed in the multi-layered semiconductor device.

26. The via structure according to claim 14, wherein a width of sides making up the frame shaped vias is formed by a semiconductor process that includes a wavelength of radiation for forming the sides, and wherein the width of the sides making up the frame shaped via is narrower than said wavelength of radiation.

27. The via structure according to claim 26, wherein a further via is provided at a position lying in between the frame shaped via sets at positions which correspond to side-lobes in the interference patterns of the radiation.

28. The via structure according to claim 14, wherein the via structures extend between two or more prescribed layers within the multi-layered semiconductor device.

* * * * *

UNITED STATES PATENT AND TRADEMARK OFFICE
CERTIFICATE OF CORRECTION

| | | |
|---|---|---|
| PATENT NO. | : 7,557,444 B2 | Page 1 of 1 |
| APPLICATION NO. | : 11/525107 | |
| DATED | : July 7, 2009 | |
| INVENTOR(S) | : Gratz et al. | |

It is certified that error appears in the above-identified patent and that said Letters Patent is hereby corrected as shown below:

On the Title page,

[*] Notice: Subject to any disclaimer, the term of this patent is extended or adjusted under 35 USC 154(b) by (146) days Delete the phrase "by 146 days" and insert --by 62 days--

Signed and Sealed this

Fifteenth Day of December, 2009

David J. Kappos
*Director of the United States Patent and Trademark Office*